United States Patent

[11] 3,611,176

[72] Inventor Todd J. Christopher
Indianapolis, Ind.
[21] Appl. No. 60,064
[22] Filed July 31, 1970
[45] Patented Oct. 5, 1971
[73] Assignee RCA Corporation

[54] FREQUENCY CONTROLLED OSCILLATOR
9 Claims, 3 Drawing Figs.

[52] U.S. Cl. .......... 331/111, 331/8, 331/20
[51] Int. Cl. .......... H03k 3/282
[50] Field of Search .......... 331/8, 20, 111

*Primary Examiner*—John Kominski
*Attorney*—Eugene M. Whitacre

ABSTRACT: An oscillator circuit employs first and second emitter coupled transistors in a switch configuration. First and second trip voltages are developed by a voltage divider network in conjunction with a third transistor and are applied to the base of the second transistor. The third transistor regeneratively aids in switching conduction states of the second transistor and changes the trip voltage applied to the base of the second transistor as well as in the input signal to an integration network coupled to the base of the first transistor to sustain oscillations. Frequency control is effected by coupling the collector-to-emitter current path of a fourth transistor in parallel with the collector-to-emitter current path of the second transistor. An automatic frequency control (AFC) voltage is applied to the base of the fourth transistor to cause the second and third transistors to switch in response to the AFC control signal instead of the fixed lower trip voltage, thereby varying the frequency oscillation of the circuit.

PATENTED OCT 5 1971 3,611,176

Figures 1, 2A, 2B:
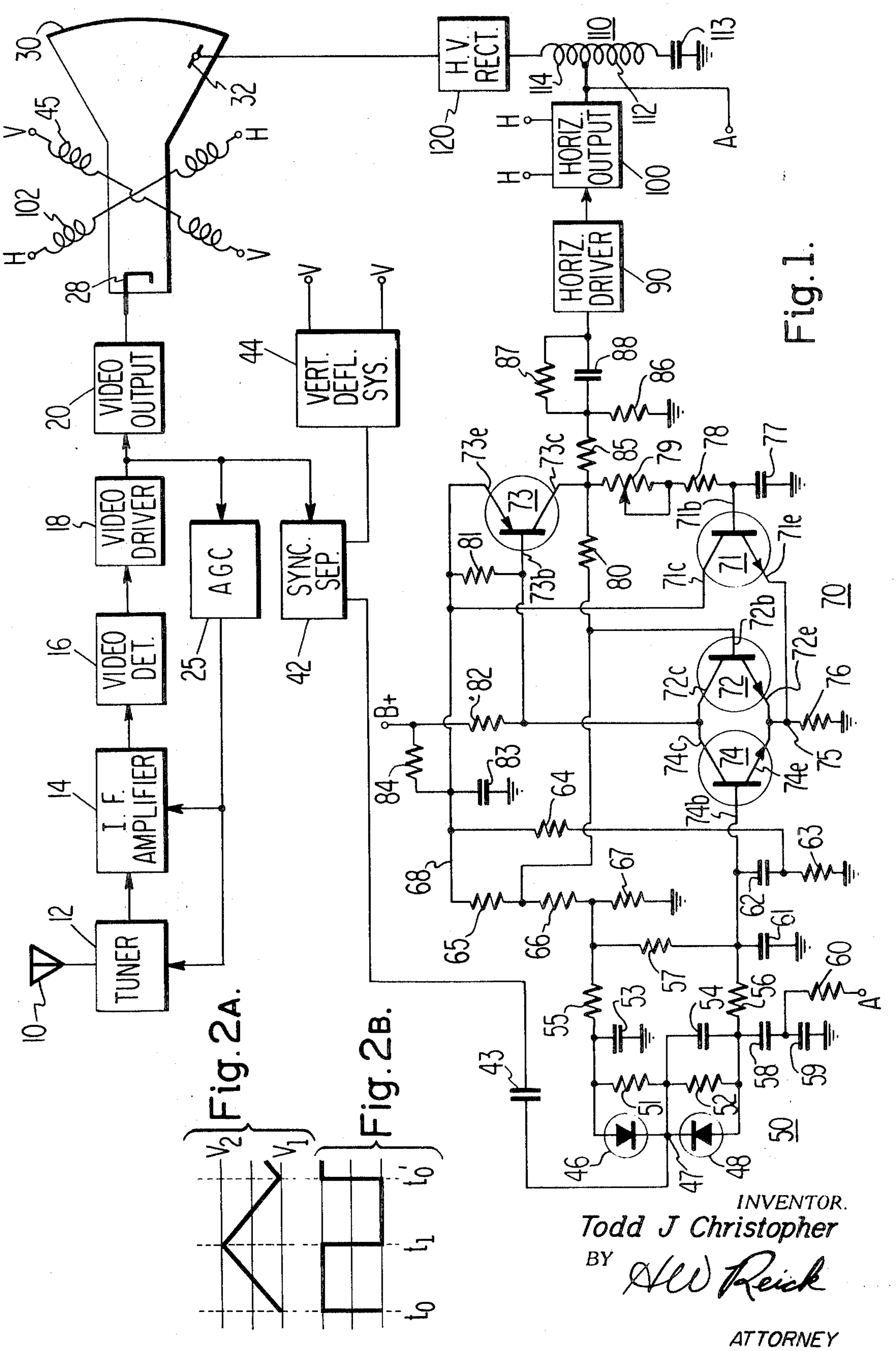

INVENTOR.
Todd J Christopher
BY H.W. Reich
ATTORNEY

FREQUENCY CONTROLLED OSCILLATOR

The present invention relates to frequency controllable oscillators and particularly to an oscillator circuit which can be employed as the horizontal oscillator in a television receiver.

Existing horizontal oscillators for television receivers of the type employing a hysteresis switch with an integration network coupled between the output and input terminals depend upon the controlling of the charging current to the integrating circuit to vary the frequency of oscillations. In such circuit arrangements, the automatic frequency control (AFC) detector normally provides continuous current to control the oscillator frequency and therefore has a relatively low impedance. The circuitry of the present invention obviates the need for an AFC circuit having a low impedance, since the AFC control is effected by effectively varying the lower trigger voltage of the trigger circuit with a control transistor that is conductive during only a very short portion of each horizontal deflection cycle. Thus, the present circuit will not load down the AFC detector and therefore can employ an AFC detector having a high or a low output impedance.

An advantage of the present circuit over a multivibrator-type horizontal oscillator used in many television receivers is that the present oscillator will automatically begin oscillating upon the application of power and does not require a startup circuit. Further, the differential configuration of the circuit allows $V_{be}$ tracking between the two differentially coupled transistors. This inherently provides frequency stability for the oscillator.

Circuits embodying the present invention include first and second transistors coupled in a differential switch configuration. Feedback circuit means couple the first and second transistors in a manner to sustain oscillations. A control transistor has its collector-to-emitter current path parallely coupled to the collector-to-emitter current path of the second transistor. Automatic frequency control signals are applied to the base of the control transistor to cause the second transistor to trigger in response to the automatic frequency control voltage. The invention can best be understood by referring to the FIGURES and accompanying description which follows.

FIG. 1 illustrates partially in block and schematic diagram form a television receiver embodying the circuitry of the present invention; and FIG. 2A and FIG. 2B are waveform diagrams showing signal waveforms present at two locations in the circuit of FIG. 1.

Referring to FIG. 1 in detail, an antenna 10 receives television signals and couples these signals to a tuner 12 which selects the desired radiofrequency signals of a predetermined broadcast channel, amplifies these signals, and converts the amplified radiofrequency signals to a lower intermediate frequency (I.F.). The tuner 12 is coupled to an I.F. amplifier 14 which amplifies the intermediate frequency signals. The output of I.F. amplifier 14 is coupled to a video detector 16 which derives video information from the I.F. signals. The video detector 16 is coupled to a video driver stage 18 which amplifies the video signals. The output of the video driver stage 18 is coupled to a video output stage 20, an automatic gain control stage 25 and a synchronizing separator stage 42. An output signal from video driver stage 18 may also be coupled to a sound channel (not shown) to reproduce the audio portion of the transmitted television program. The video output stage 20 applies amplified video information to a control element, such as a cathode 28, of a kinescope 30.

The automatic gain control stage 25 operates in a conventional manner to provide gain control signals which are applied to a radiofrequency amplifier included in tuner 12 and to the I.F. amplifier 14. Sync separator 42 separates the synchronization information from the video information and also separates the horizontal synchronizing information from the vertical synchronizing information. The vertical synchronizing pulses derived from sync separator 42 are applied to the vertical deflection system 44 which provides the required deflection current to a vertical deflection winding 45 associated with kinescope 30 by means of the interconnection V—V.

The horizontal synchronizing pulses from sync separator 42 are coupled by a capacitor 43 to an automatic frequency control detector 50 which develops a control signal which synchronizes the frequency of a horizontal oscillator 70 with the transmitted horizontal synchronizing pulse frequency.

The AFC stage 50 operates in a conventional manner to develop the AFC control voltage. Stage 50 is keyed by negative sync pulses applied to terminal 47. Diodes 46 and 48 conduct differing amounts depending on the timing relationship of the arriving sync pulses and a reference signal applied to terminal A from a horizontal output stage 100 to vary the AFC control voltage developed at the junction of resistors 46 and 57. Coupling capacitors 58 and 54 apply the reference signals from stage 100 to terminal 47 of the detector. Diodes 46 and 48 are bridged by resistors 51 and 52 as shown in the figure. The anode of diode 46 is floated above ground by means of a resistor 55 which couples the diode to a voltage divider comprising resistors 65, 66 and 67 which is coupled from a conductor 68 to a reference potential such as ground. A capacitor 53 is coupled from the junction of resistors 51 and 55 to ground. A resistor 56 couples the control signals from the AFC detector to the AFC filter which comprises capacitor 61, capacitor 62 and resistor 63 coupled as shown in the diagram. A resistor 57 is shunted across the AFC detector and serves to limit the excursion of the AFC voltage. The junction of capacitor 62 and resistor 63 is DC biased by means of a resistor 64 coupled to conductor 68. Conductor 68 is coupled to a power source illustrated as B+ by means of a voltage dropping resistor 84 and is maintained at a relatively constant direct voltage by means of filter capacitor 83.

The horizontal oscillator 70 comprises a first transistor 71 and a second transistor 72 having their emitter terminals coupled to a common terminal 75 which is returned to a reference potential by means of a resistor 76. Terminal 75 likewise could be coupled to a suitable current source. A third transistor 73 has its base terminal 73*b* coupled to a collector terminal 72*c* of transistor 72. An emitter terminal 73*e* of transistor 73 is coupled to conductor 68. A resistor 81 is coupled between the base terminal 73*b* and the emitter terminal 73*e* of transistor 73.

An integrating network comprising a capacitor 77, a resistor 78 and an adjustable resistor 79 (which serves as the horizontal hold control) couples the collector terminal 73*c* of transistor 73 to a base terminal 71*b* of transistor 71. A resistor 80 couples the collector terminal 73*c* of transistor 73 to a base terminal 72*b* of transistor 72. The base terminal 72*b* is further coupled to the junction of resistors 65 and 66 included in the voltage divider network (65, 66, 67). Collector terminal 72*c* of transistor 72 is coupled to the B+ power supply by means of a resistor 82.

A fourth transistor (control transistor) 74 has a collector terminal 74*c* coupled to the collector terminal 72*c* of transistor 72. Its emitter terminal 74*e* is coupled to the emitter terminal 72*e* of transistor 72 as well as the emitter terminal 71*e* of transistor 71 at the common junction terminal 75. A base terminal 74*b* of transistor 74 is coupled to the output of the AFC detector 50 at the junction of AFC filter capacitors 61 and 62.

Output signals from the horizontal oscillator 70, which appear at the collector 73*c* of transistor 73, are coupled to a horizontal driver stage 90 by means of the network comprising resistors 85, 86 and 87, and capacitor 88 coupled as shown in the figure. The horizontal driver 90 amplifies the incoming horizontal frequency signals and applies them to a horizontal output stage 100 which develops the required horizontal deflection current. This deflection current is applied to a horizontal yoke 102 associated with kinescope 30 by means of the interconnection H—H. The horizontal output stage 100 also supplies current to a horizontal output transformer 110 having a primary winding 112 coupled to ground by means of a capacitor 113. A secondary winding 114 on transformer 110 provides relatively high-voltage pulses to a high-voltage rectifier 120 whose output voltage is utilized to provide the ultor voltage to kinescope 30 at terminal 32. Signals appearing across the primary winding 112 are utilized as the reference signal for the AFC circuit and are coupled to the AFC circuit 50 by interconnecting terminals A—A. These reference signals which appear in the form of positive flyback pulses are integrated by capacitor 59 in conjunction with series resistance 60 to form a sawtooth-shaped waveform.

The operation of the horizontal oscillator circuit 70 can more easily be understood by referring to FIGS. 2A and 2B which illustrate the voltage waveform at the base of transistor 71 and at the collector of transistor 73 respectively. In FIG. 2, the time represented by $t_0$ represents the beginning of one cycle of the operation of the horizontal oscillator, $t_1$ represents the center portion of the cycle, and $t_0'$ represents the end of the cycle and the beginning of a successive cycle of operation.

Turning first to the operation of the basic oscillator without the addition of the control transistor 74, it is seen that as the B+ voltage is initially applied to the circuit, capacitor 77 will be fully discharged and transistor 71 will be nonconductive. Transistor 72 will at this time be rendered conductive by the positive voltage applied to base terminal **72*b* from the divider network 65, 66 and 67. Transistor 73 is also conductive, since the decreasing collector voltage of transistor 72 is applied to the base 73*b* of transistor 73. While transistor 73 conducts, its collector voltage will be at approximately the same voltage as conductor 68 (+30 volts in one embodiment), and supplies charging current to capacitor 77 during the $t_0$–$t_1$ time interval. During this time interval, the collector voltage is also applied to the base 72*b* of transistor 72 by means of resistance 80 and applies (in conjunction with network 65, 66 and 67) the upper (first) trigger voltage to the base of transistor 72**. This voltage is represented as $V_2$ in FIG. 2A and is approximately 17 volts in one embodiment.

As the voltage across capacitor 77 reaches voltage level $V_2$ at time $t_1$, transistor 71 will be forward biased, since the voltage at terminal 75 is equal to $V_2$ less the forward voltage drop across the base-emitter junction of transistor 72. As transistor 71 is rendered conductive, transistor 72 will begin to turn off, and its collector voltage will rise. Since the base terminal **73*b* of transistor 73 is coupled to the collector terminal 72*c* of transistor 72, this increasing collector voltage will turn transistor 73 off. As transistor 73 begins turning off, its collector 73*c* voltage decreases. The first conduction path between transistors 72 and 73 comprising resistor 80 applies this decreasing collector voltage signal to the base of transistor 72 to regeneratively aid in turning transistor 72 off. With transistor 72 nonconducting, transistor 73 likewise is regeneratively turned off by a second conduction path from the collector terminal 72*c* of transistor 72 to the base terminal 73*b* of transistor 73. Thus, while transistor 71 is conductive, transistors 72 and 73 will be nonconductive, and the collector voltage of transistor 73 approaches zero. At this time, the base voltage on transistor 72 represented by $V_1$ in FIG. 2A is determined by the voltage dividing network 65, 66 and 67 and resistors 80, 85 and 86 and is derived from the interconnection of base terminal 72*b* to the junction of resistors 65, 66 and 80. With the collector terminal 73*c* at nearly zero voltage, capacitor 77 will discharge through resistors 78, 79 and 85, 86 and the voltage at the base 71*b* of transistor 71 decreases as shown in FIG. 2A during the time interval $t_1$–$t_0'$ toward the $V_1$ (second) voltage level (which is approximately 13 volts in one embodiment). As the capacitor 77 discharges to the $V_1$ level, transistor 72 will be forward biased and rendered conductive, since its emitter terminal 72 *e* is held at the $V_1$ voltage less the forward base-to-emitter voltage drop across transistor 71. As transistor 72 conducts, its decreasing collector voltage causes transistor 73 to begin turning on which regeneratively turns on transistor 72 by means of the first conduction path. As this occurs, the collector 73*c* of transistor 73 again approaches the voltage at conductor 68. Transistor 71 will be rendered nonconductive, since its base voltage remains at the $V_1$ level due to the charge on capacitor 77 and its emitter voltage is equal to the $V_2$ level less the forward voltage drop of transistor 72**.

Thus, without the addition of transistor 74 to control the frequency of oscillations of the oscillator, the base voltage of transistor 71 will swing between the upper trigger voltage $V_2$ and the lower trigger voltage $V_1$. As it approaches these trigger voltages, transistors 72 and 73 will be switched to change the trigger voltage level and the input voltage to the integrating circuit, thereby causing the circuit to oscillate and providing a square wave voltage waveform at terminal **73*c*** as illustrated in FIG. 2B.

With the addition of transistor 74, the effective lower triggering voltage $V_1$ is varied while the triggering voltage $V_2$ remains fixed, thereby changing the frequency of oscillations of the system. Transistor 74 varies the time of conduction of transistor 72. As described earlier, the AFC detector circuit 50 is direct voltage biased by the bleeder network 65, 66 and 67 so that the average direct voltage level present at the base **74*b* of transistor 74** is at a level to effect synchronized oscillation of the horizontal oscillator.

It is seen that transistor 72 conducts as the base voltage on transistor 71 approaches the lower trigger voltage $V_1$. With the addition of transistor 74, however, if the base voltage of transistor 74 is at a level somewhat higher (that is in a direction toward $V_2$), transistor 74 will conduct prior to the conduction of transistor 72, since the base voltage of transistor 72 is fixed. Thus, as transistor 74 momentarily conducts, because it is forward biased, it will turn on transistor 73 since the collector of transistor 74 is tied to the base of transistor 73. As transistor 73 conducts due to the negative going collector voltage on transistor 74, transistor 72 will be rendered conductive by means of the signal coupled to its base terminal by the first conduction path. As transistor 72 conducts, its emitter voltage is switched to the $V_2$ level less the forward voltage drop of the base-to-emitter junction of transistor 72. Since the AFC voltage will always be less than the $V_2$ level, transistor 74 becomes nonconductive as does transistor 71. Thus, transistor 74 will conduct only momentarily to switch transistors 72 and 73 into conduction. It is this feature which allows the horizontal oscillator 70 to be employed with an AFC circuit having a high output impedance. This is possible since the duty cycle of transistor 74 is relatively short which prevents excessive loading of the preceding stage.

It is seen that the AFC voltage developed by stage 50 will be somewhat more positive than the lower trip voltage $V_1$ when the oscillator is synchronized with the incoming sync pulses. This allows for a control range for frequency deviations in either direction. The frequency is changed by effectively changing the peak-to-peak waveform shown in FIG. 2A by varying the effective second trip voltage $V_1$.

It is noted that $V_1$ is the voltage applied to the base of transistor 72 and is actually fixed. Transistor 72 responds however to the conduction of control transistor 74 as if the lower trip voltage $V_1$ were being varied. If the oscillator is out of synchronization with incoming sync pulses at terminal 47 of AFC circuit 50, the changing AFC voltage developed by stage 50 will increase or decrease to cause transistor 74 to conduct earlier or later, thereby causing transistors 72 and 73 to switch conduction states in a manner to correct the horizontal oscillator frequency.

The following parameters have been employed in a preferred embodiment:

| | | |
|---|---|---|
| Transistors | | |
| | 71, 72, 74 | 2N3694 NPN |
| | 73 | 2N4355 PNP |
| Resistors | | |
| | 51, 52 | 100,000 ohms |
| | 55, 56 | 390,000 ohms |
| | 57, 60 | 330,000 ohms |
| | 63, 64 | 4,700 ohms |
| | 65, 67 | 15,000–2% ohms |
| | 66 | 1,000–2% ohms |
| | 76, 79, 87 | 15,000 ohms |
| | 78 | 27,000 ohms |
| | 80 | 27,000–2% ohms |

Continued

| | | |
|---|---|---|
| 81 | | 6,800 ohms |
| 82 | | 220,000 ohms |
| 84 | | 12,000 ohms |
| 85 | | 5,600 ohms |
| 86 | | 680 ohms |
| Capacitors | | |
| 53 | | 0.033 microfarad |
| 54 | | 150 picofarads |
| 58 | | 3,300 picofarads |
| 59 | | 2,200 picofarads |
| 61 | | 0.0082 microfarad |
| 62 | | 0.47 microfarad |
| 77 | | 0.0039 microfarad |
| 83 | | 18 microfarads |
| 88 | | 0.01 microfarad |
| B+ | +140 volts DC | |

What is claimed is:

1. An oscillator circuit comprising:

first and second transistors each having base, collector and emitter terminals and having their emitter terminals coupled at a common junction, feedback circuit means for applying signals from said collector terminal of said second transistor to said base terminal of said first transistor and for alternately developing first and second trigger voltages, means for applying said first and second trigger voltages to said base terminal of said second transistor timed in a manner to sustain oscillations of a frequency determined by the alternate conduction of said first and said second transistors, a source of frequency control signals, and a control transistor having its collector-to-emitter current path parallely coupled to the collector-to-emitter current path of at least one of said first or second transistors and having its base terminal coupled to said source of control signals to cause said first and second transistors to change conduction states, thereby varying the frequency of oscillations.

2. A circuit as defined in claim 1 wherein said feedback circuit means includes a third transistor having base, collector and emitter terminals, said base terminal of said third transistor coupled to said collector terminal of said second transistor, said collector terminal of said third transistor coupled to said base terminal of said first transistor and said emitter terminal of said third transistor coupled to a reference potential.

3. A circuit as defined in claim 2 wherein said feedback means further includes an integrating circuit coupled from said collector terminal of said third transistor to said base terminal of said first transistor.

4. A circuit as defined in claim 3 including:

biasing means coupled to said collector terminal of said third transistor to alternately establish first and second trigger voltage levels in response to the conduction state of said third transistor, and means for applying said first or second voltages to said base terminal of said second transistor.

5. A circuit as defined in claim 4 wherein said collector terminal of said control transistor is coupled to said collector terminal of said second transistor and said emitter terminal of said control transistor is coupled to said emitter terminal of said second transistor, said control transistor responsive to signals from said source of control signals to cause said second and third transistors to conduct in response to said control signal instead of said second trigger voltage level.

6. An oscillator circuit comprising:

first and second transistors of the same conductivity type, each having base, collector and emitter terminals, said emitter terminal of said first transistor coupled to said emitter terminal of said second transistor, a third transistor having base, collector and emitter terminals and of opposite conductivity type than said first and second transistors, said collector terminal of said third transistor coupled to said base terminal of said first transistor and further coupled to said base terminal of said second transistor, said base terminal of said third transistor coupled to said collector terminal of said second transistor to form a regenerative feedback loop between said second and third transistors, biasing means coupled to said collector terminal of said third transistor for alternately developing first and second trigger voltages in response to the conduction state of said third transistor, and means for applying said first and second trigger voltages to said base terminal of said second transistor in a manner to sustain oscillations whose frequency is determined by the alternate conduction of said first and second transistors.

7. A circuit as defined in claim 6 and further including an integrating network coupled from said collector terminal of said third transistor to said base terminal of said first transistor.

8. An oscillator circuit comprising:

first and second transistors each having base, collector and emitter terminals, said transistors coupled in a differential switch configuration, a third transistor having base, collector and emitter terminals, said collector terminal of said third transistor coupled to said base terminal of said second transistor, said base terminal of said third transistor coupled to said collector terminal of said second transistor, an integrating network coupled from said collector terminal of said third transistor to said base terminal of said first transistor, a biasing network coupled to said collector terminal of said third transistor for alternately developing first and second trigger voltages in response to the conduction state of said third transistor, means for applying said first and second trigger voltages to said base terminal of said second transistor to sustain oscillations, a fourth transistor having base, collector and emitter terminals, said collector terminal coupled to said collector terminal of said second transistor, said emitter terminal coupled to said emitter terminal of said second transistor, a source of frequency control signals, and means for applying said control signals to said base terminal of said fourth transistor to cause said fourth transistor to conduct thereby causing said second and third transistors to be rendered conductive to vary the frequency of said oscillator in response to variations in said control signal.

9. A circuit as defined in claim 8 wherein said fourth transistor conducts only momentarily to cause said second and third transistors to be rendered conductive.